(12) United States Patent  
Goldenson (10) Patent No.: US 9,631,920 B2
(45) Date of Patent: Apr. 25, 2017

(54) SENSING SYSTEM FOR VERIFYING DEADBOLT ENGAGEMENT

(71) Applicant: Google Inc., Mountain View, CA (US)

(72) Inventor: Andrew W. Goldenson, Palo Alto, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

(21) Appl. No.: 14/516,524

(22) Filed: Oct. 16, 2014

(65) Prior Publication Data

US 2016/0290005 A1   Oct. 6, 2016

Related U.S. Application Data

(60) Provisional application No. 61/891,885, filed on Oct. 16, 2013, provisional application No. 61/897,768, filed on Oct. 30, 2013.

(51) Int. Cl.
| | |
|---|---|
| *E05B 45/06* | (2006.01) |
| *G01B 7/30* | (2006.01) |
| *G01R 33/02* | (2006.01) |
| *G01R 33/028* | (2006.01) |
| *E05B 45/08* | (2006.01) |
| *E05B 47/00* | (2006.01) |
| *G01D 5/14* | (2006.01) |

(52) U.S. Cl.
CPC ............... *G01B 7/30* (2013.01); *E05B 45/083* (2013.01); *E05B 47/0038* (2013.01); *G01R 33/02* (2013.01); *G01R 33/0286* (2013.01); *E05B 2045/0665* (2013.01); *E05B 2047/0069* (2013.01); *G01B 2210/58* (2013.01); *G01D 5/145* (2013.01)

(58) Field of Classification Search
CPC ..... G01B 7/30; G01B 2210/58; E05B 45/083; E05B 47/0038; E05B 2045/0665; E05B 2047/0069; G01R 33/02; G01R 33/0286; G01D 5/145

See application file for complete search history.

(56) References Cited

U.S. PATENT DOCUMENTS

| | | | | |
|---|---|---|---|---|
| 3,782,147 A | * | 1/1974 | Hallmann | ........... E05B 47/0042 70/276 |
| 4,656,850 A | * | 4/1987 | Tabata | ................ E05B 47/0673 292/144 |
| 4,918,957 A | * | 4/1990 | Eisermann | .............. E05B 13/00 70/276 |

(Continued)

*Primary Examiner* — Quang D Pham
(74) *Attorney, Agent, or Firm* — Morgan, Lewis & Bockius LLP (57) ABSTRACT

A door lock detection system is disclosed. The system includes a magnet flexibly attached to a strike plate. The strike plate includes an opening. The magnet extends across the opening of the strike plate in a first orientation when a bolt does not extend into the opening of the strike plate. The magnet is configured to be deflected from the first orientation to a second orientation, distinct from the first orientation, in response to the bolt being extended into the opening of the strike plate. The system includes a magnetometer configured to detect one or more magnetic fields of the magnet that is flexibly attached to the strike plate in the first orientation and in the second orientation.

20 Claims, 6 Drawing Sheets

(56) References Cited

U.S. PATENT DOCUMENTS

| | | | | |
|---|---|---|---|---|
| 5,029,912 A * | 7/1991 | Gotanda | | E05B 47/0046 |
| | | | | 292/143 |
| 5,377,513 A * | 1/1995 | Miyamoto | | E05B 47/0607 |
| | | | | 70/276 |
| 5,925,861 A * | 7/1999 | Fromberg | | E05B 15/1621 |
| | | | | 200/61.67 |
| 6,094,952 A * | 8/2000 | Clark | | E05B 17/2092 |
| | | | | 70/278.1 |
| 6,310,549 B1 * | 10/2001 | Loftin | | G08B 13/08 |
| | | | | 324/207.21 |
| 6,474,120 B1 * | 11/2002 | Wadsworth | | E05B 63/185 |
| | | | | 292/251.5 |
| 6,950,033 B1 * | 9/2005 | Guyre | | E05B 17/10 |
| | | | | 340/542 |
| 7,498,936 B2 * | 3/2009 | Maeng | | G08B 21/24 |
| | | | | 340/10.3 |
| 2004/0100254 A1 * | 5/2004 | Viitanen | | E05B 17/22 |
| | | | | 324/207.26 |
| 2005/0044908 A1 * | 3/2005 | Min | | E05B 47/0012 |
| | | | | 70/276 |
| 2006/0049645 A1 * | 3/2006 | Drumm | | E05C 19/163 |
| | | | | 292/251.5 |
| 2007/0069894 A1 * | 3/2007 | Lee | | E05B 45/06 |
| | | | | 340/542 |
| 2008/0012359 A1 * | 1/2008 | Aschieri | | E05B 63/20 |
| | | | | 292/251.5 |
| 2008/0083242 A1 * | 4/2008 | Muller | | E05B 47/02 |
| | | | | 62/331 |
| 2008/0196313 A1 * | 8/2008 | Fink | | E06B 7/20 |
| | | | | 49/380 |
| 2012/0119523 A1 * | 5/2012 | Burdenko | | E05B 47/026 |
| | | | | 292/251.5 |
| 2012/0167646 A1 * | 7/2012 | Sharma | | G01B 7/31 |
| | | | | 70/280 |
| 2012/0172763 A1 * | 7/2012 | King | | A61B 5/1071 |
| | | | | 600/595 |
| 2012/0299314 A1 * | 11/2012 | Jiang | | E05B 45/083 |
| | | | | 292/137 |
| 2013/0265162 A1 * | 10/2013 | Buckley | | G08B 13/08 |
| | | | | 340/545.1 |
| 2013/0305490 A1 * | 11/2013 | Sprague | | E05B 65/0025 |
| | | | | 16/412 |
| 2014/0035302 A1 * | 2/2014 | Koch | | E05B 15/022 |
| | | | | 292/341.17 |
| 2014/0104437 A1 * | 4/2014 | Chao | | H04N 17/002 |
| | | | | 348/187 |
| 2014/0292001 A1 * | 10/2014 | Nunez | | E05C 1/004 |
| | | | | 292/164 |

* cited by examiner

SENSING SYSTEM FOR VERIFYING DEADBOLT ENGAGEMENT

RELATED APPLICATIONS

This application claims priority and benefit to U.S. Provisional Application No. 61/891,885, filed Oct. 16, 2013, entitled "Robust Sensing System for Verifying Engagement of a Deadbolt Bolt into a Deadbolt Strike Plate," and to U.S. Provisional Application No. 61/897,768, filed Oct. 30, 2013, entitled "Robust Sensing System for Verifying Deadbolt Engagement Including Door Angle Sensing Subsystem." All of these applications are incorporated by referenced herein in their entireties.

TECHNICAL FIELD

This relates generally to door locks, including but not limited to sensing systems for verifying deadbolt engagement.

BACKGROUND

As discussed in U.S. Pat. No. 6,950,033 to Guyre, entitled "Door Bolt Alarm," which is incorporated by reference herein, it is desirable for purposes of home security and homeowner reassurance for a user to be able to know for certain whether a door to their home, such as a front door, is properly closed and that the deadbolt is properly engaged. Security systems, building automation systems, and HVAC systems all benefit from knowing the state of doors, such as whether they are open or closed, locked or unlocked, and the like. Several known deadbolt systems are able to verify that a bolt of the deadbolt system is either extended or retracted and are able to communicate this status in various ways to a user. However, the status of the bolt as being extended or retracted is not necessarily indicative of the true security state of the door. For example, it may be the case that the bolt is extended, but that the door is still partially open. Moreover, many existing systems require wiring to be installed in door frames and/or door jambs, which can be expensive and complicated to install and maintain.

Thus, existing systems cannot reliably verify that a door has indeed been shut and that the deadbolt has indeed been properly engaged. Moreover, existing systems are complex and often include a multitude of sensors and require significant wiring.

SUMMARY

Accordingly, it would be desirable to provide a system that can reliably verify that a door has indeed been shut and that the deadbolt has indeed been properly engaged. It would be further desirable to provide such a system in a manner that does not require a high degree of complexity, does not require an inordinate number of sensors, and does not require an inordinate number of wires.

In accordance with some embodiments, a door lock detection system includes a magnet flexibly attached to a strike plate (e.g., by spring, hinge, or combination thereof). The strike plate includes an opening. The magnet extends across the opening of the strike plate in a first orientation when a bolt does not extend into the opening of the strike plate. The magnet is configured to be deflected from the first orientation to a second orientation, distinct from the first orientation, in response to the bolt being extended into the opening of the strike plate. The door lock detection system also includes a magnetometer configured to detect one or more magnetic fields of the magnet that is flexibly attached to the strike plate in the first orientation and in the second orientation.

In accordance with some embodiments, a method is performed by a door lock detection system that has a magnet flexibly attached to a strike plate. The strike plate includes an opening. The magnet extends across the opening of the strike plate in a first orientation when a bolt does not extend into the opening of the strike plate. The magnet is configured to be deflected from the first orientation to a second orientation, distinct from the first orientation, in response to the bolt being extended into the opening of the strike plate. The door lock detection system also has a magnetometer configured to detect one or more magnetic fields of the magnet that is flexibly attached to the strike plate in the first orientation and in the second orientation; and a controller. The method includes detecting, with the magnetometer, one or more magnetic fields of the magnet that is flexibly attached to the strike plate; determining whether the detected one or more magnetic fields correspond to the magnet being in the second orientation; and based at least in part on determining that the detected one or more magnetic fields correspond to the magnet being in the second orientation, relaying, with the controller, to at least one other system information that indicates that the bolt is engaged in the strike plate.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

DESCRIPTION OF EMBODIMENTS

Figure 1A:
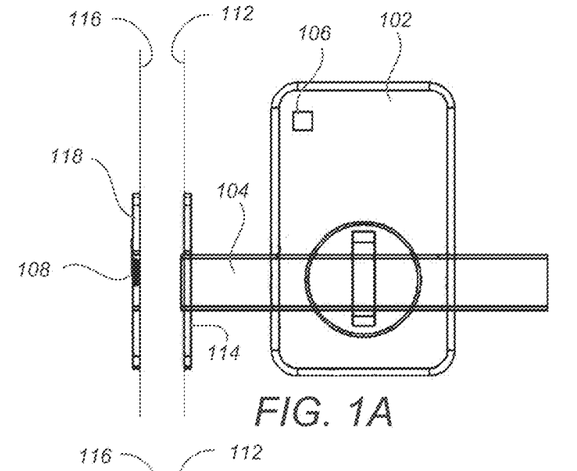
FIG. 1A is a front view of a deadbolt assembly in accordance with some embodiments.
Figure 1B:
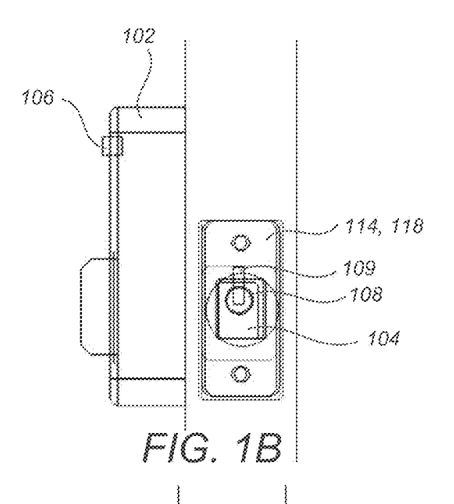
FIG. 1B is a side view of a deadbolt assembly in accordance with some embodiments.

FIGS. 1A, 1B, 2A, and 2B illustrate a sensing system for verifying that a door is properly shut and that a deadbolt is properly engaged. More particularly, FIGS. 1A and 1B illustrate front and side views, respectively, of a deadbolt assembly 102 mounted on a door 112 that has been shut into a door jamb 116, wherein a bolt 104 of the deadbolt assembly 102 is in a retracted state. As with conventional systems, there is a deadbolt face plate 114 affixed to the door 112, and a deadbolt strike plate 118 affixed to the door jamb 116. In some embodiments, there is provided a magnet 108 that is flexibly and springably attached to the deadbolt strike plate 118, such as by flex/spring member 109, such that the magnet 108 extends across the opening of the deadbolt strike plate 118. In some embodiments, the deadbolt assembly 102 is provided with a magnetometer 106. The magnetometer 106 and the magnet 108 are mutually configured and dimensioned such that the magnetometer 106 can sense a change in orientation of the magnet 108. In particular, when the magnet 108 is deflected, the magnetic field that is produced by the magnet is correspondingly deflected. In some embodiments, magnetic field readings from the magnetometer 106 are compared against previous readings to determine whether the readings correspond to a deflected magnetic field (e.g., resulting from the bolt 104 deflecting the magnet 108), or an undeflected magnetic field (e.g., resulting from the bolt 104 not deflecting the magnet 108).

Figure 2A:
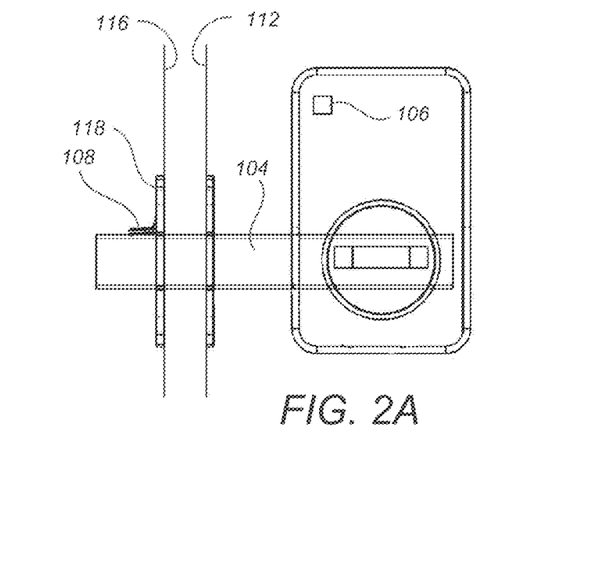
FIG. 2A is a front view of a deadbolt assembly in accordance with some embodiments.
Figure 2B:
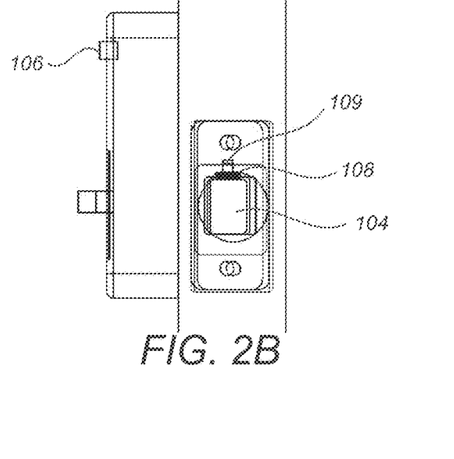
FIG. 2B is a side view of a deadbolt assembly in accordance with some embodiments.
Figure 3A:
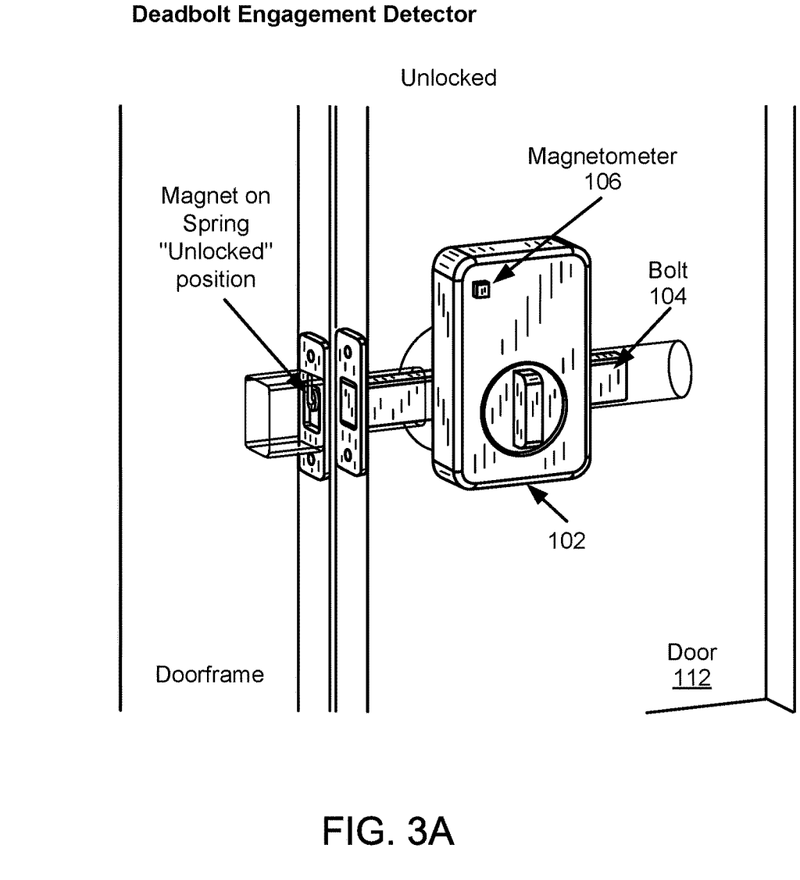
FIGS. 3A-3B are perspective views of a deadbolt assembly in accordance with some embodiments.
Figure 3B:
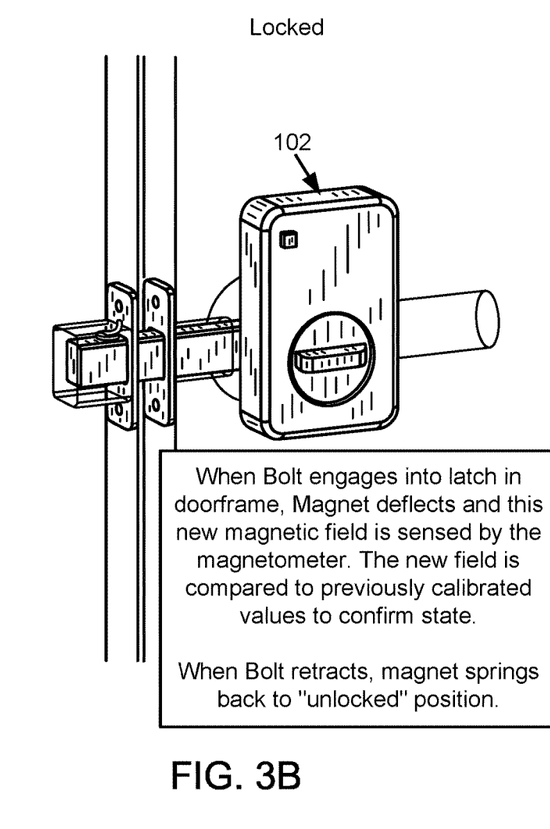
Figure 4A:
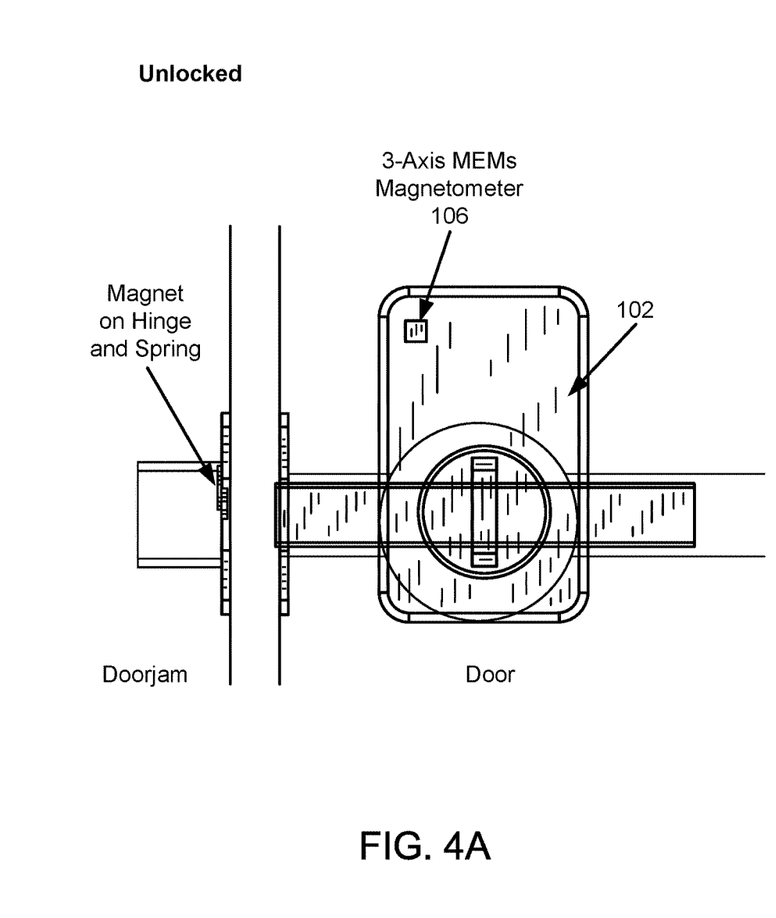
FIGS. 4A-4D are front views of a deadbolt assembly in accordance with some embodiments.
Figure 4B:
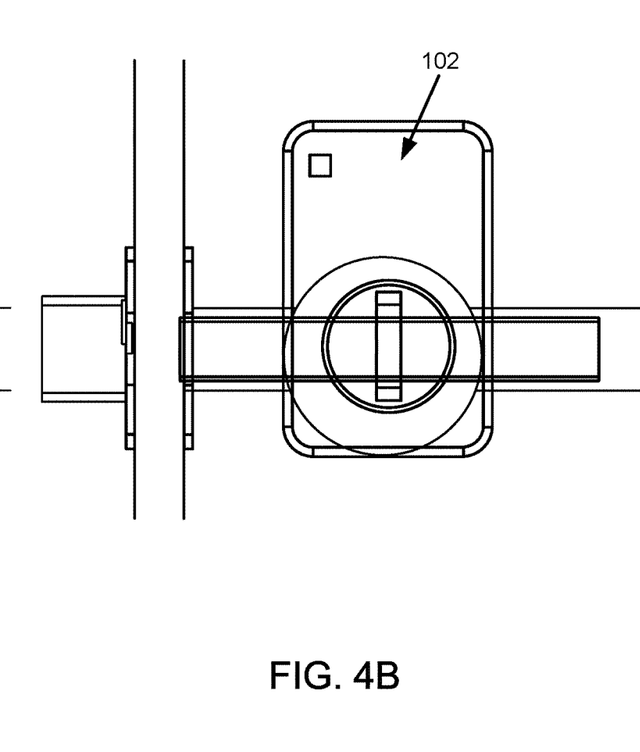
Figure 4C:
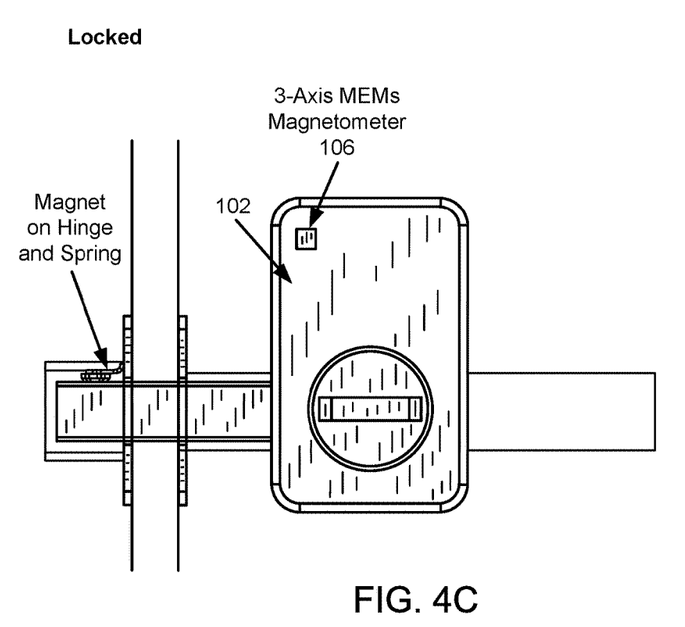
Figure 4D:
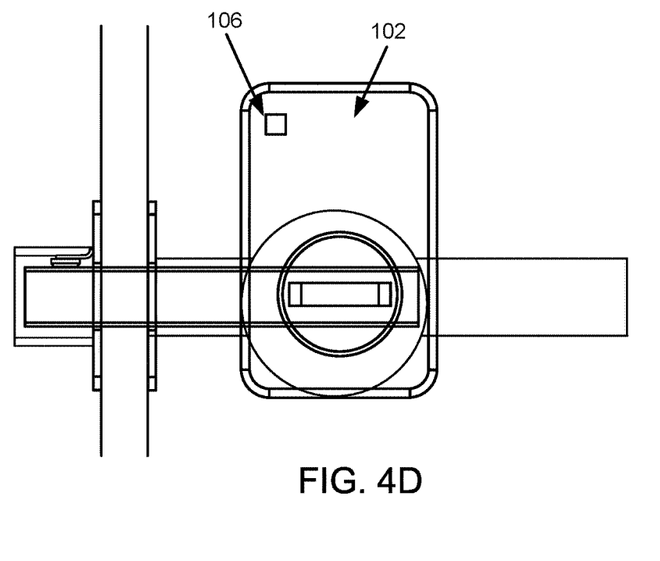
Figure 5A:
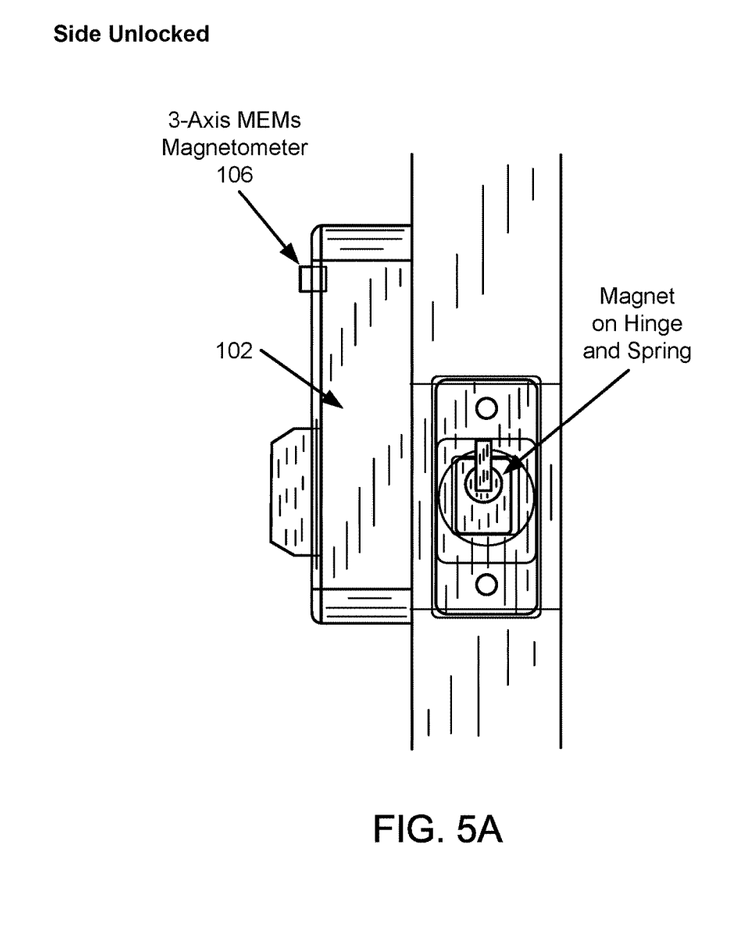
FIGS. 5A-5D are side views of a deadbolt assembly in accordance with some embodiments.
Figure 5B:
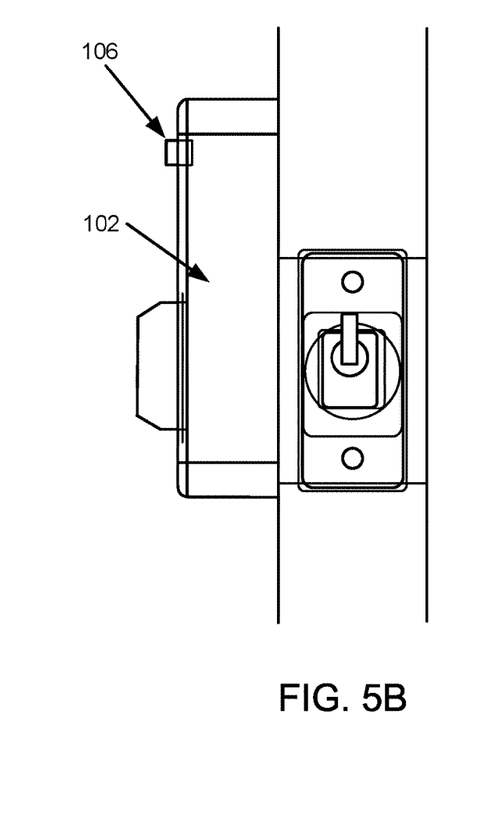
Figure 5C:
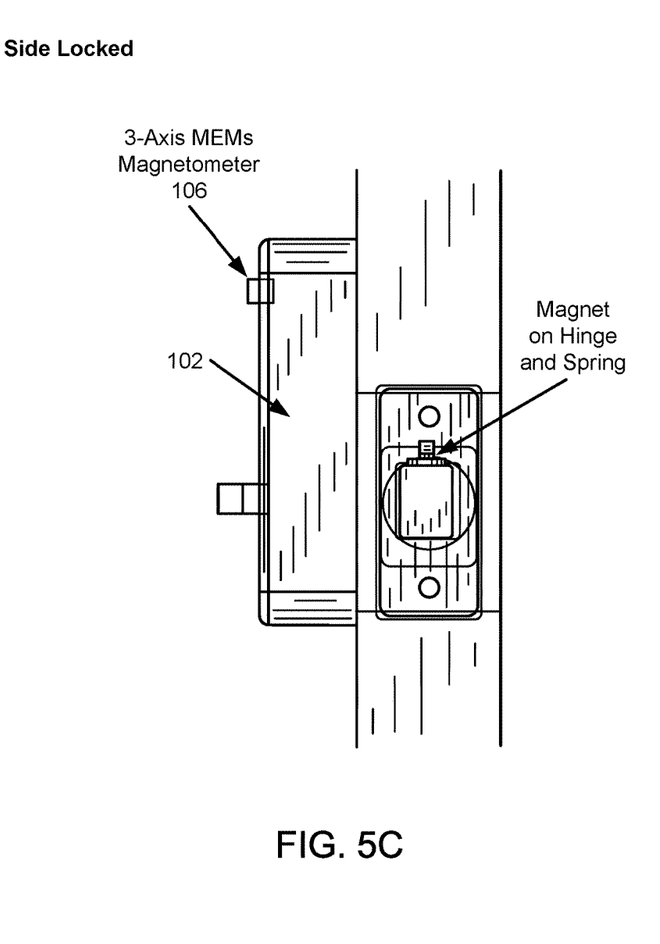
Figure 5D:
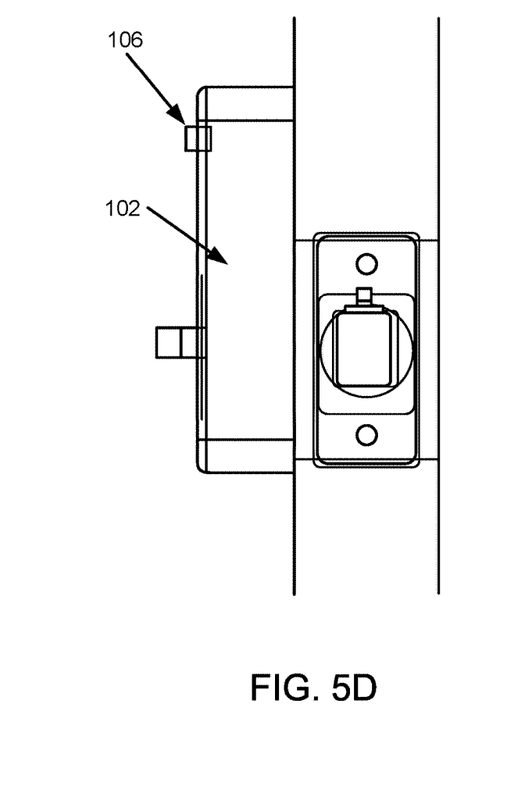

FIGS. 2A and 2B illustrate corresponding front and side views, respectively, of the sensing system of FIGS. 1A and 1B in which the bolt 104 is in an extended state. FIGS. 3A and 3B illustrate perspective views, FIGS. 4A-4D illustrate front views, and FIGS. 5A-5D illustrate side views of the sensing system in accordance with some embodiments. As shown in FIGS. 2A and 2B, the magnet 108 has changed its orientation by 90 degrees by virtue of the mechanical insertion of the bolt 104 through the opening of the deadbolt strike plate 118, an orientation change that is detected by magnetometer 106. In some embodiments, this change in orientation is communicated from the magnetometer 106 to one or more user interfaces using a variety of different electronics and communications configurations, such as those described in Guyre, supra.

Advantageously, false engagement signals associated with the situation of an extended bolt but unclosed door are avoided, because the magnet 108 will not change orientation in that case. Conversely, false engagement signals associated with a situation of a rotated magnet 108 but non-extended bolt (such as by a person sticking their finger into the opening of the deadbolt strike plate) is also avoided, because if the door is not closed, then the magnetometer 106 will be too far from the magnet 108 to sense its orientation change. In some embodiments, false engagement signals are still further avoided by virtue of a separate sensing system (not shown) onboard the deadbolt assembly 102 for sensing whether the bolt has been extended (e.g., by optical sensing, electrical bumper switch, magnetic sensing, etc.). In such cases, the conclusion that the door has been closed and the deadbolt locked is reached when it is determined that both (a) the bolt has been extended (e.g., as determined by the separate sensing system), and (b) the magnet 108 has changed its orientation (e.g., as determined by the magnetometer 106).

One example of a commercially available magnetometer suitable for use with the present system is an ASAHIKASEI AKM AK8963 3-axis electronic compass. In a calibration step in the locked position, the X, Y, and Z magnetic fields reported by the magnetometer are measured. Within a tolerance, when this same combination of fields is seen again (and, optionally, the bolt is known to be extended), it is determined that the door is securely locked. One example of a magnet that can be used is a Neodymium rare earth magnet, such as a Neodymium disc magnet having dimensions of 0.5 inch diameter by 0.125 inch thickness.

The disclosed systems and methods use minimally invasive sensors to identify if a deadbolt is properly engaged in a doorframe, as opposed to merely detecting if the deadbolt is out but the door is not closed. Using a strike plate that mounts inside the doorframe, the bolt deflects a magnet when the bolt is properly engaged into the strike plate. Once the door is locked (i.e., the bolt is extended through an opening of the strike plate and into a door jamb), a magnetometer measures the magnetic field it senses. If the magnetometer senses a magnetic field substantially equivalent to the previously calibrated magnetic field (e.g., which corresponds to the magnetic field that is sensed when the bolt deflects the magnet in the latch in the doorframe), it is determined that the bolt is engaged properly in the doorframe and that the door is secured. A microcontroller relays this information to other systems such as a door mounted notification light or alarm, a security system, and/or a control panel. In some embodiments, the system is also connected to an electromechanical door locking/unlocking mechanism.

The disclosed embodiments provide numerous advantages over conventional deadbolts. For example, as noted above, conventional deadbolts (even electromechanical ones) do not know if the bolt (when extended) actually extends into the door jamb securing the door; they just know if the bolt is extended or retracted. In the disclosed embodiments, however, there is no need for an electrical switch inside the door jamb to sense that the bolt is engaged. Rather, the sensor that determines whether the bolt is engaged or not is external to the door jamb and strike plate (e.g., it is coupled to a deadbolt assembly mounted to the door). Also, because there is no electrical switch, there is no need to run electrical wires inside the doorjamb. Indeed, in some embodiments, the strike plate is retrofitted into existing door jambs without additional wiring. Furthermore, the disclosed embodiments do not require redesigning conventional bolts or locking mechanisms, as the magnet and magnetometer are agnostic to the particular locking mechanism being used. Indeed, the disclosed embodiments will work well with both manually operated and electromechanical door locks to provide feedback if the deadbolt is actually engaged.

In some embodiments, the deadbolt assembly 102 is further configured and adapted to sense the particular angle of the door (e.g., 0 degrees corresponding to a completely closed state, 10 degrees corresponding to a cracked or partially open state, 90 degrees corresponding to an open state, and so forth). For example, a microelectromechanical system (MEMs) magnetometer mounted to a door senses door orientation (i.e. closed, open, partially open) by measuring changes in orientation with respect to the earth's magnetic field or a reference magnetic field (e.g., a stationary a magnet or coil). In some embodiments, this MEMs magnetometer can be one and the same as the magnetometer 106. For other embodiments, the door-angle-sensing MEMs magnetometer is a separate magnetometer than the magnetometer 106 provided with the deadbolt assembly 102. In still other embodiments, the door-angle-sensing MEMs magnetometer is mounted in a separate device or structure on the door. In addition to or as an alternative to the door-angle-sensing MEMs magnetometer, a MEMs gyroscope ("gyro") device is optionally included in the deadbolt assembly 102 or otherwise mounted to a door for measuring the angular rate of the door opening or closing. Knowing time, after integrating the gyro, the door's angular relative position from a known starting point is determined, thereby allowing determination of the door's absolute opening angle. By way of example and not by way of limitation, examples of suitable MEMs gyros include the BOSCH BMG160, the ST LPY410A, and the ST A3G4250D.

Information regarding the door angle is useful in a variety of different ways. In some embodiments, the door angle information is used to verify that the door is indeed properly closed (i.e., completely closed, as opposed to partially or fully open). Another use includes communicating the door angle to a user interface screen of a user, so that the user can determine, from a remote location, whether and to what extent the door is open. Another useful application arises for doorways equipped with a screen door, (i.e., a second door that allows air to pass in and out while also keeping out insects and other pests), or for other doors such as interior doors that affect air circulation in the house. In such embodiments, the detected door angle is communicated to an HVAC system for any of a variety of useful purposes relating to the monitoring or governing of air flow in the home. Additionally, applications further include doors equipped with associated motors and linkages for achieving automated opening and closing, where the door angle is used as part of a feedback control system.

What is claimed is:

1. A door lock detection system, comprising:
a magnet flexibly attached to a strike plate, wherein:
the strike plate includes an opening;
the magnet extends across the opening of the strike plate in a first orientation when a bolt does not extend into the opening of the strike plate; and
the magnet is configured to be deflected by the bolt from the first orientation to a second orientation, distinct from the first orientation, in response to the bolt being extended into the opening of the strike plate; and
a magnetometer configured to detect one or more magnetic fields of the magnet that is flexibly attached to the strike plate in the first orientation and in the second orientation.

2. The door lock detection system of claim 1, including a controller that relays to at least one other system information that indicates whether the bolt is engaged in the strike plate, wherein the information that indicates whether the bolt is engaged in the strike plate is derived at least in part from one or more magnetic fields, detected by the magnetometer, of the magnet that is flexibly attached to the strike plate.

3. The door lock detection system of claim 2, wherein the at least one other system is a security system, a notification alarm, a notification light, and/or a control panel.

4. The door lock detection system of claim 1, wherein the magnet is flexibly attached to the strike plate with a spring.

5. The door lock detection system of claim 1, wherein the magnet is flexibly attached to the strike plate with a spring-loaded hinge.

6. The door lock detection system of claim 1, wherein one or more magnetic fields detected by the magnetometer when the magnet is in the second orientation are equivalent, within a tolerance, to one or more magnetic fields measured, in a prior calibration step, by the magnetometer when the bolt is engaged in the strike plate and the magnet is deflected.

7. The door lock detection system of claim 1, including a bolt extension detector configured to detect whether the bolt is extended.

8. The door lock detection system of claim 1, including a door orientation sensor configured to detect an orientation of a door to which the bolt is coupled.

9. The door lock detection system of claim 8, wherein the door orientation sensor is a microelectromechanical system (MEMs) magnetometer.

10. The door lock detection system of claim 9, wherein the MEMs magnetometer is the same as the magnetometer that is configured to detect magnetic fields of the magnet that is flexibly attached to the strike plate.

11. The door lock detection system of claim 8, wherein the door orientation sensor is a microelectromechanical system (MEMs) gyroscope.

12. The door lock detection system of claim 1, wherein the magnetometer is a 3-axis magnetometer.

13. The door lock detection system of claim 1, wherein the strike plate is affixed to a door jamb, and wherein the bolt and the magnetometer are coupled to the door.

14. A method, comprising:
at a door lock detection system having:
a magnet flexibly attached to a strike plate, wherein:
the strike plate includes an opening;
the magnet extends across the opening of the strike plate in a first orientation when a bolt does not extend into the opening of the strike plate; and
the magnet is configured to be deflected by the bolt from the first orientation to a second orientation, distinct from the first orientation, in response to the bolt being extended into the opening of the strike plate;
a magnetometer configured to detect one or more magnetic fields of the magnet that is flexibly attached to the strike plate in the first orientation and in the second orientation; and
a controller;
detecting, with the magnetometer, one or more magnetic fields of the magnet that is flexibly attached to the strike plate;
determining whether the detected one or more magnetic fields correspond to the magnet being in the second orientation; and
based at least in part on determining that the detected one or more magnetic fields correspond to the magnet being in the second orientation, relaying, with the controller, to at least one other system information that indicates that the bolt is engaged in the strike plate.

15. The method of claim 14, wherein the at least one other system is a security system, a notification alarm, a notification light, and/or a control panel.

16. The method of claim 14, wherein the magnet is flexibly attached to the strike plate with a spring.

17. The method of claim 14, wherein one or more magnetic fields detected by the magnetometer when the magnet is in the second orientation are equivalent, within a tolerance, to one or more magnetic fields measured, in a prior calibration step, by the magnetometer when the bolt is engaged in the strike plate and the magnet is deflected.

18. The method of claim 14, wherein the door lock detection system includes a bolt extension detector configured to detect whether the bolt is extended, the method including:
detecting, with the bolt extension detector, whether the bolt is extended;
based at least in part on determining that the detected one or more magnetic fields correspond to the magnet being in the second orientation and detecting that the bolt is extended, relaying, with the controller, to at least one other system information that indicates that the bolt is engaged in the strike plate.

19. The method of claim 14, wherein the door lock detection system includes a door orientation sensor configured to detect an orientation of a door to which the bolt is coupled, the method including:
detecting, with the door orientation sensor, whether the door is closed; and
in response to detecting that the door is closed, sending an indication that the door is closed to at least one electronic device.

20. The method of claim 14, wherein the door lock detection system includes a door orientation sensor configured to detect an orientation of a door to which the bolt is coupled, the method including:
  detecting, with the door orientation sensor, whether the door is closed; and
  based at least in part on determining that the one or more detected magnetic fields correspond to the magnet being in the second orientation and detecting that the door is closed, relaying, with the controller, to at least one other system information that indicates that the bolt is engaged in the strike plate.

* * * * *